United States Patent [19]
Hikita et al.

[11] Patent Number: 6,152,304
[45] Date of Patent: Nov. 28, 2000

[54] COMPONENT HOLDER

[75] Inventors: Osamu Hikita, Yamanashi; Satoshi Kosugi, Takaoka; Masamitu Miyazaki, Neyagawa, all of Japan

[73] Assignee: Matsushita Electric Industrial Co., Ltd., Osaka, Japan

[21] Appl. No.: 09/308,172

[22] PCT Filed: Nov. 18, 1997

[86] PCT No.: PCT/JP97/04179

§ 371 Date: Jun. 18, 1999

§ 102(e) Date: Jun. 18, 1999

[87] PCT Pub. No.: WO98/22371

PCT Pub. Date: May 28, 1998

[30] Foreign Application Priority Data

Nov. 18, 1996 [JP] Japan ................................ 8-306211

[51] Int. Cl.[7] .................................................. B65D 85/86
[52] U.S. Cl. ........................................ 206/714; 206/713
[58] Field of Search .......................... 206/1.5, 713, 714, 206/717, 724, 560, 486

[56] References Cited

U.S. PATENT DOCUMENTS

| | | | |
|---|---|---|---|
| 5,727,688 | 3/1998 | IIshii et al. | 206/724 |
| 5,823,341 | 10/1998 | Nakasuji | 206/1.5 |
| 6,003,675 | 12/1999 | Maruyama et al. | 206/714 |

FOREIGN PATENT DOCUMENTS

| | | |
|---|---|---|
| 0570128A1 | 11/1993 | European Pat. Off. . |
| 0660655A1 | 6/1995 | European Pat. Off. . |
| 8-32283 | 2/1996 | Japan . |

*Primary Examiner*—David T. Fidei
*Attorney, Agent, or Firm*—Wenderoth, Lind & Ponack, L.L.P.

[57] ABSTRACT

A connecting hole is provided at one end of holder units oriented in a direction of connection of the holder units, and at the other end a connecting protrusion is provided which fits into the connecting hole and projects in a direction perpendicular to the direction of connection for engagement. The connecting protrusion is constructed by a pair of engagement pieces (15) disposed in parallel spaced relation in a direction perpendicular to the direction of connection and deformable toward each other. Locking protrusions are provided at a front end outer surfaces of the engagement pieces, which are adapted to engage peripheral edges of longitudinally opposite ends of the connecting hole for preventing dislocation. At one end of the holder unit in the direction of connection of the holder units there is provided a connection positioning hole and at the other end there is provided a connection positioning portion having a connecting protrusion which fits into the connection positioning hole.

26 Claims, 7 Drawing Sheets

COMPONENT HOLDER

TECHNICAL FIELD

The present invention relates to a component holder assembly constructed from a plurality of component holder units connected together for storing various kinds of components, such as electronic components, optical components, and mechanical components, and more particularly to an improvement to a connector device for connecting component holder units of the component holder assembly.

BACKGROUND ART

Hitherto, a holder tape formed with many storage recesses spaced at predetermined intervals has been used as a component holder assembly for holding a multiplicity of components, and for mounting the holder assembly as an assembly of components on a component supply device, in such a way that after components having been stored in the recesses, the upper side of the holder tape is covered with a cover tape for restraining popping up of the components.

However, with such a component holder assembly, it is necessary that for the purpose of storing components, the holder tape must be covered with the cover tape and that for the purpose of feeding components, the cover tape must be peeled off and, in turn, taken up. This necessitates a complex component feeder device, and the peeled-off cover tape is disposed of as a throw-away waste, resulting in higher cost or the like.

Therefore, in order to solve such an issue, the applicant previously proposed a component holder assembly 121 as shown in FIG. 4, the assembly comprising a multiplicity of component holder units 122 (only two shown in the drawing) connected together. The component holder unit 122 has a component holding portion 123 formed in a central portion thereof, with feed holes 124 formed at a predetermined pitch on opposite sides in the direction of connecting. At opposite sides of the holding portion 123 there are provided engagement pieces 125 which are respectively connected by a pair of link pieces 126 at both sides integrally to side walls opposed to each other in the direction of connection of holder units 122, the engagement pieces 125 being adapted to be movable between a projected position and a retracted position in relation to a top opening of the holding portion 123. At the projected position, the engagement pieces 125 engage the upper surface of a component stored in the holding portion 123 to prevent popping up of the component, and at the retracted position, the engagement pieces 125 permit the component to be inserted into the holding portion 123 and held therein, or to be released therefrom.

At one end edge of the holder unit 122 oriented in the direction of connecting, there are provided a pair of protrusions 133 formed with an elongate connecting hole 134 in suitably spaced relation in a direction perpendicular to the direction of connection of the holder assembly 121. At the other end edge of the holder unit 122 oriented in the direction of connecting, engagement protrusions 132 adapted to fit into the connecting holes 134 are provided at positions corresponding to the connecting holes 134. The engagement protrusions 132 have, at one side, a locking pawl 115 projecting therefrom. At the inner side of the locking pawl 115 there is formed a recessed portion 116 wider than the width of the pawl 115 such that both ends of the locking pawl 115 and side end walls of the recessed portion 116 are connected by thin connecting walls to enable the locking pawl 115 to be retracted into the recessed portion 116 by a suitable external force and to securely return to its original state.

However, with the construction of above described connector device, after the locking pawl 115 fits into the connecting hole 134, a gap exists between the locking pawl 115 and the inner wall of the connecting hole 134, which causes a play in the connection of the holder units 122 in a direction perpendicular to the direction of connection, and therefore, the component holder assembly 121 cannot secure its straightness. As such, even when component holder units 122 are positioned by a component holder assembly feeding device, units other than the so positioned units cannot be positioned in place. As a result, in bringing drive sprockets of the holder assembly feeding device into engagement with feed holes, the sprocket cannot engage some feed holes and this may possibly cause some deviation in holder assembly advance, rattling of holder assembly, and some error in holder assembly feed amount.

Therefore, it is an object of the present invention to provide a component holder assembly which makes it possible to easily connect holder units and provides for high precision connection. Disclosure Of Invention In order to accomplish the above mentioned object, the present invention is constructed as follows.

According to a first aspect of the present invention, there is provided a component holder assembly constructed from a plurality of component holder units connected together for holding components, the component holder assembly comprising:

a first connector portion and a first connection positioning portion having a connection positioning hole, at one end of each of the component holder units oriented in the direction of connection; and at the other end of each of the component holder units oriented in the direction of connection a second connector portion adapted to be connected to the first connector portion and a second connection positioning portion having a connection positioning projection adapted to tightly fit into the connection positioning hole.

According to a second aspect of the present invention, there is provided a component holder assembly as set forth in the first aspect, wherein the first connector portion is provided at least two in number at the one end of each of the holder units oriented in the direction of connection so that the first connection positioning portion is disposed between the two first connector portions, and the second connector portion is provided at least two in number at the other end of each of the holder units oriented in the direction of connection so that the second connection positioning portion is disposed between the two connector portions.

According to a third aspect of the present invention, there is provided a component holder assembly as set forth in the first aspect, wherein the first connector portion is disposed in a vicinity of one side of the one end of each of the holder units oriented in the direction of connection; the first connection positioning portion is disposed in a vicinity of the other side thereof; the second connector portion is disposed in a vicinity of one side of the other end of each of the holder units oriented in the direction of connection; and the second connection positioning portion is disposed in a vicinity of the other side of the other end.

According to a fourth aspect of the invention, there is provided a component holder assembly as set forth in any one of the first to third aspects, wherein the first connector portion has a connecting hole extending through the holder unit in a direction, perpendicular to the direction of connection, of entry and removal of the components relative to the component holder unit; and the second connector portion has a connecting protrusion extending in the direction, perpendicular to the direction of connection, of the entry and the removal of the components relative to the component holder unit which is adapted to fit into the connecting hole and project therefrom for engagement in a direction perpendicular to the direction of connection, the connecting protrusion comprising a pair of engagement pieces arranged in parallel spaced relation in a direction perpendicular to the direction of connection and elastically deformable toward each other, the pair of engagement pieces having, at a front end outer side thereof, locking projections engageable with peripheral edges of longitudinally oriented ends of the connecting hole for dislocation or coming-off purposes.

According to a fifth aspect of the present invention, there is provided a component holder assembly as set forth in any one of the first to fourth aspects, wherein the first connection positioning portion has a circular hole extending through the component holder unit in a direction, perpendicular to the direction of connection, of entry and removal of the components relative to the component holder unit; and the second connection positioning portion has a cylindrical pin extending in the direction, perpendicular to the direction of connection, of the entry and removal of the components relative to the component holder unit, and adapted to be closely fitted into the circular hole.

According to a sixth aspect of the present invention, there is provided a component holder assembly as set forth in the fourth aspect, wherein the first connection positioning portion has a circular hole extending through the component holder unit in the direction, perpendicular to the direction of connection, of the entry and removal of the components relative to the component holder unit; and the second connection positioning portion has a cylindrical pin extending in the direction, perpendicular to the direction of connection, of the entry and discharge of the components relative to the component holder unit, and adapted to be closely fitted into the circular hole, the cylindrical pin having an axially larger length than the connecting protrusion of the first connector portion, whereby when the plurality of component holder units are connected together, the cylindrical pin of the first connection positioning portion begins to closely fit into the circular hole of the second connection positioning portion before the respective connecting protrusions of the first connector portion of one of the component holder units are fitted into the corresponding connecting holes of the second connector portion of the other of the component holder units.

According to a seventh aspect of the present invention, there is provided a component holder assembly as set forth in any one of the first to sixth aspects, wherein a portion of the component holder unit where the second connector portion is caused to project from the component holder unit and a portion of the component holder unit where the second connection positioning portion is caused to project from the component holder unit have notches respectively so that the second connector portion and the second connection positioning portion are deformable in a like manner relative to the component holder unit, so that when a plurality of aforesaid component holder units are connected together so that the second connector portion and the second connection positioning portion are deformed relative to the component holder unit in the same manner as aforesaid, whereby the component holder units can be taken up in a tape-like form.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1A:
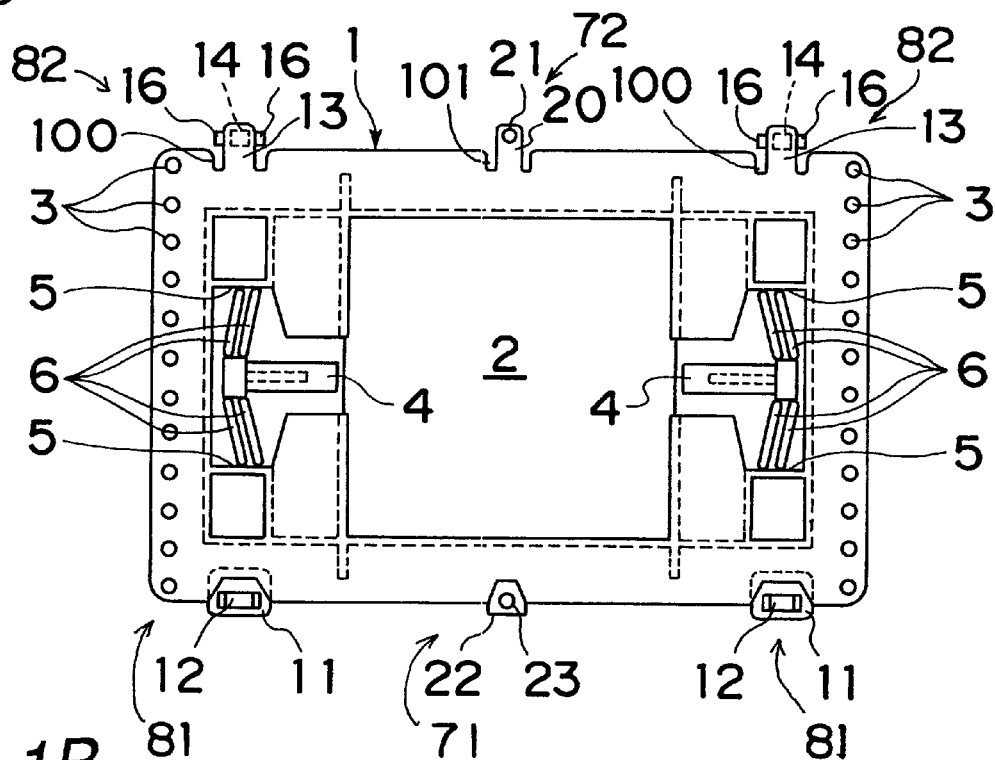
FIG. 1A is a plan view of a holder unit in a component holder assembly according to one embodiment of the present invention.

Before the description of the present invention proceeds, it is to be noted that like parts are designated by like reference numerals throughout the accompanying drawings.

Figure 2A:
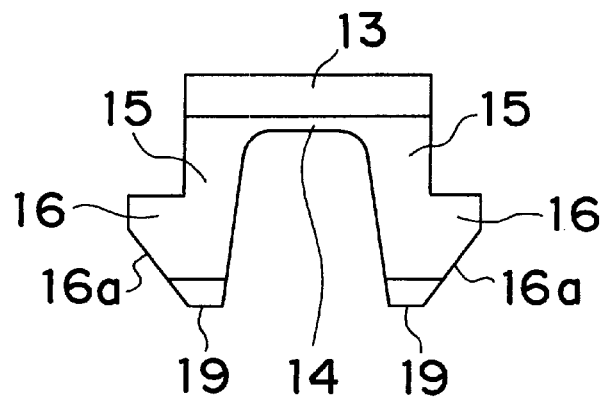
FIG. 2A is a front view of the connecting protrusion of the connection retainer portion in the component holder assembly of the embodiment.
Figure 2B:
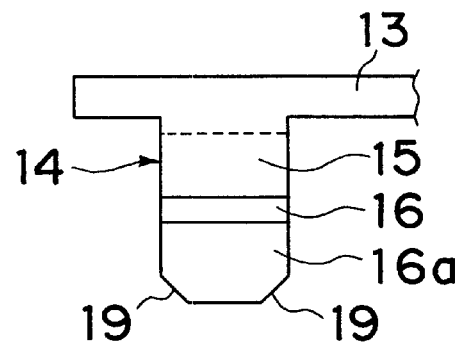
FIG. 2B is a side view of the connecting protrusion in the embodiment.
Figure 2C:
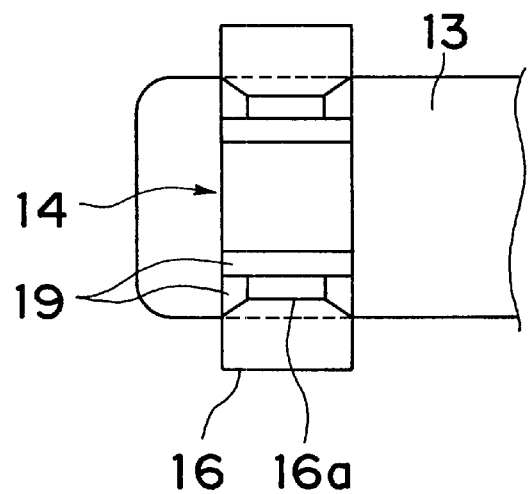
FIG. 2C is a bottom plan view of the connecting protrusion in FIG. 2B.
Figure 3A:
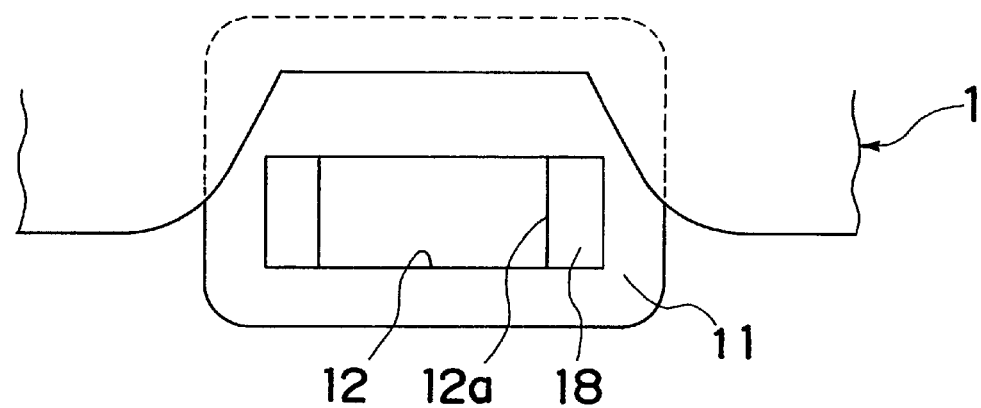
FIG. 3A is a plan view of the connecting hole in the connection retainer portion of the component holder assembly according to the embodiment.

A component holder assembly according to one embodiment of the present invention will now be described with reference to FIGS. 1 to 3.

Numeral 1 designates a holder unit such that a multiplicity of holder units 1 connected together constitute a component holder assembly, each holder unit 1 having a retainer portion 2 for storing and holding therein components including, for example, electronic components, such as QFP (Quad Flat Package), so that a tape-form assembly of components is formed. The holder unit 1 is comprised of an injection molded product of resin material such as polypropylene or polyethylene, and has a planar shape of substantially rectangular configuration which is longer in a direction perpendicular to the direction of connection, with a flat recessed portion formed at the central portion thereof to define the retainer portion 2. At both sides of the holder unit 1 there are formed feed holes 3 arranged at a specified pitch in the direction of connection of the holder units.

Figure 4:
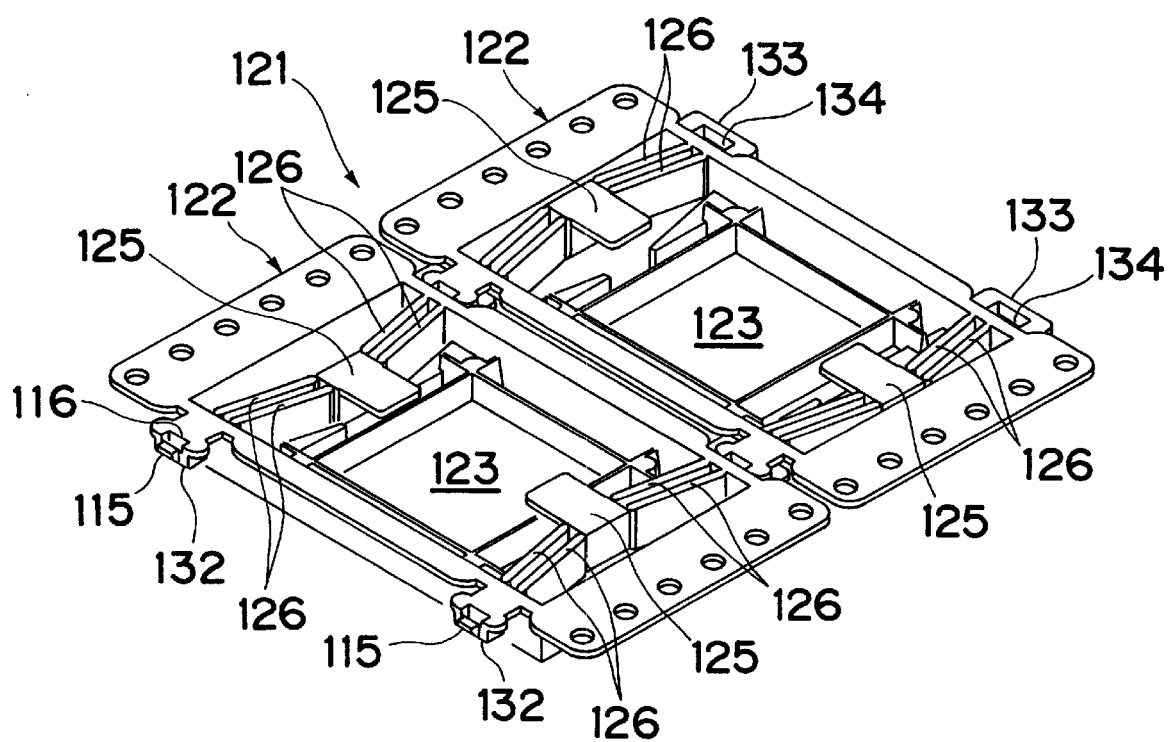
FIG. 4 is an outline view in perspective of a conventional component holder assembly.

At both sides of the retainer portion 2 there are provided engagement pieces 4 movable between projected positions and retracted positions in relation to an opening of the upper surface of the retainer portion 2. The engagement pieces 4, at their projected positions (a projected condition similar to that in the case of engagement pieces 125 of a holder unit 122 as seen at the front side in FIG. 4), can engage the top of a component stored in the retainer portion 2 to prevent the popping out of the component and, at their retracted positions (a retracted position similar to that in the case of the engagement pieces 125 of the holder unit 122 as seen at the back side in FIG. 4), can cause a component to be inserted into and stored in the retainer portion 2 or to be removed therefrom.

The engagement piece 4 is integrally connected at the opposite sides thereof by a pair of link pieces 6 to two support walls 5 provided in opposed relation in the direction of connection of the holder units 1. Each of the link pieces 6 has a length slightly larger than one half of a length obtained by subtracting the width of engagement piece 4 from the distance between the two support walls 5, 5, and each of the connector portions provided between the link piece 6 and both of the support wall 5 and the engagement piece 4 is pivotally movable by a self hinge formed in a thin wall portion so that the engagement piece 4 is kept stable at two positions, namely, the projected position and the retracted position, and is movable between the two positions by a biasing force larger than a given level.

At one end of each holder unit 1 in a direction perpendicular to the direction of connection there are disposed at least two first connector portions 81, and a first connection positioning portion 71 having a connection positioning hole 23 that is disposed between the first connector portions 81. Whilst, at the other end of each holder unit 1 in a direction perpendicular to the direction of connection there are disposed at least two second connector portions 82, and a second connection positioning portion 72 having a second connection positioning protrusion 21, adapted to closely fit into the connection positioning hole 23, is provided between the second connector portions 82.

In particular, at one end of the holder unit 1 as viewed in a direction perpendicular to the direction of the holder units 1 there is provided a pair of protrusions 11 in suitably spaced relation which are formed with an elongate connection hole 12 extending through the component holder unit 1 in a direction of receipt and removal of components relative to the component holder unit. This direction of receipt and removal is perpendicular to the direction of connection of the holder units, and is elongated in a direction perpendicular to the direction of receipt and removal and the direction of connection. This pair of protrusions 11 functions as one example of the first connector portions 81. Intermediate the pair of protrusions 11 there is provided a projection 22 formed with a circular connection positioning hole 23. This projection 22 functions as one example of a first connection positioning portion 71. In FIG. 1A, the projection 22 is positioned centrally between the pair of protrusions 11; but this does not limit the position of the projection 22.

At the other end of the holder unit 1 in the direction perpendicular to the direction of connection, there are provided connecting band portions 13 adaptable to fit into the connecting holes 12, each band portion 13 extending in the direction of connection of the holder units 1, and each band portion 13 having a connecting projection 14 elongated in a direction perpendicular to the direction of connection. The connecting band portion 13 functions as one example of the second connector portion 82. Intermediate the pair of connector band portions 13 there is provided a connection positioning band portion 20 formed with a connection positioning pin 21 comprised of a solid cylindrical pin adaptable to closely fit into the connection positioning hole 23. The connection positioning band portion 20 functions as one example of the second connection positioning portion 72. In FIG. 1A, the connection band portion 20 is positioned centrally between the pair of projections 14; but this does not limit the position of the connection band portion 20.

The portion of the component holder unit from where each second connector portion 82 is to be projected, and the portion of the component holder unit from where the second connection positioning portion 72 is to be projected, respectively have notches 100, 101. These notches 100, 101 enable each of the second connector portions 82 and the second connection positioning portion 72 to be equally deformable relative to the component holder unit 1. By connecting a plurality of component holder units 1 to enable each second connector portion 82 and the second positioning portion 72 to be equally deformed relative to the component holder unit 1 as already mentioned, the component holder units 1 can be taken up in a tape-like form.

Figure 3B:
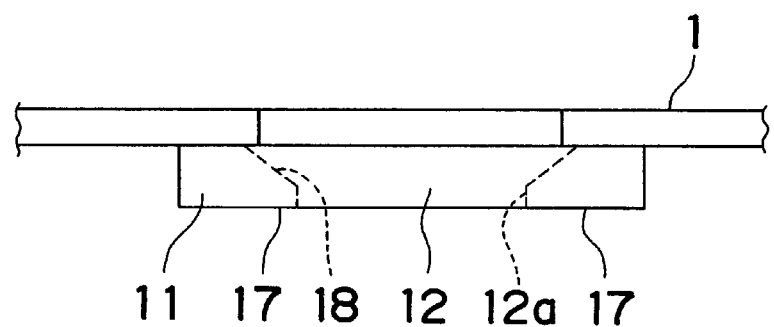
FIG. 3B is a front view of the connecting hole in the embodiment.

The connecting projections 14 are arranged in spaced parallel relation in a direction perpendicular to the direction of connection. As shown in detail in FIGS. 2A–2C, each projection 14 has a pair of proximal engagement pieces or spaced resilient extensions 15 elastically deformable toward each other or approaching each other; and at outer sides of front ends of the pair of distal engagement pieces 15 there are provided locking protrusions 16 for engagement with engagement surfaces 17 formed on undersides of peripheral edges at longitudinally spaced opposite ends of the connecting holes 12 for preventing dislocation or coming-off, as shown in FIG. 3B. Each locking protrusion 16 is configured to have an approximately triangular shape such that its outer side 16a is inclined to flare from the distal end toward the proximal end of the engagement piece 15. The connecting hole 12, as shown in FIGS. 1B, 1C, and 3A, 3B in detail, is formed at sides 12a of longitudinally spaced ends thereof with a guide surface 18 which extends away from the direction of insertion of the connecting projection 14 into connecting hole 12. The guide surface 18 may be constructed by an inclined plane surface as shown in figures, or may be constructed by an upwardly raised curved surface. The engagement piece 15 has chamfered portions 19 at both edges of the front end thereof in the direction perpendicular to the direction of connection, so as to facilitate insertion of projection 14 into connecting hole 12.

Figure 1B:
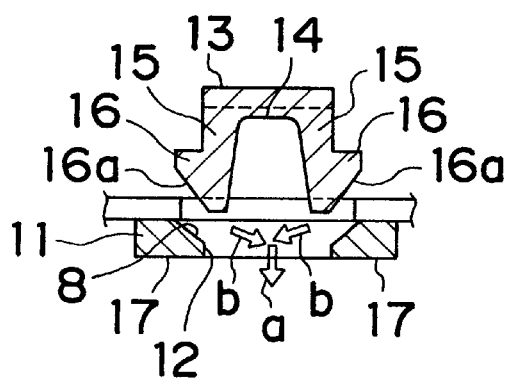
FIG. 1B is a vertical sectional view showing the condition of a connection retainer portion in the embodiment just before the connection of a connecting hole and a connecting protrusion.

In the foregoing arrangement, for the purpose of connecting the holder units 1 to each other, as FIG. 1B shows, right above the connecting holes 12 and the connection positioning hole 23 at one end edge of one holder unit 1 are positioned the connector projections 14 and the positioning pin 21 at the other end edge of another holder unit 1, respectively. Then, the connecting projections 14 and the positioning pin 21 are lowered, together with the another holder unit 1, as shown by the arrow a, whereupon the inclined outer surfaces 16a of the locking protrusions 16 one pair of engagement pieces 15 are contacted with the guide surfaces 18 at both sides of the connecting hole 12, whereby the one pair of engagement pieces 15 are elastically deformed inwardly as shown by the arrows b and then, the connecting projection 14 fits into the connecting hole 12. The positioning pin 21 fits into the connection positioning hole 23 earlier than the projection 14 fits into connection hole 12. In this fitting operation, the earlier fitting of the positioning pin 21 than the fitting of the connection projections 14 provides an advantage in that the positioning of the component holder units 1 to each other can be facilitated. However, the fitting of the positioning pin 21 and the fitting of the connecting projections 14 may be carried out simultaneously. Conversely, the fitting of the connecting projections 14 may be carried out earlier than that of the positioning pin 21.

Figure 1C:
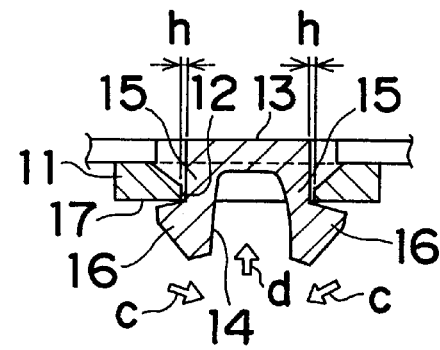
FIG. 1C is a vertical sectional view showing the condition of the connection retainer portion in the embodiment with the connecting hole and the connecting protrusion connected together.
Figure 1D:
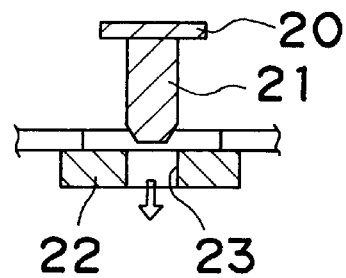
FIG. 1D is a vertical sectional view showing the condition of the connection positioning portion in the embodiment just before the connection of a connecting hole and a connecting protrusion.
Figure 1E:
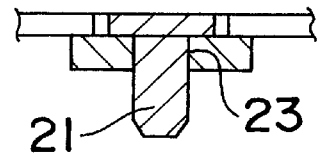
FIG. 1E is a vertical sectional view showing the condition of the connection positioning portion in the embodiment with the connecting hole and the connecting protrusion connected together.

When the connecting projection 14 is completely fitted into the connecting hole 12, the locking protrusions 16 pass through the connecting hole 12 and the engagement pieces 15 return to their home positions; and as shown in FIG. 1C, the locking protrusions 16 engage the engagement surfaces 17 on the undersides of the peripheral edges at the longitudinally opposite ends of the connecting hole 12, whereby dislocation of the connecting projection 14 can be prevented and the holder units 1 are connected together.

Gaps 2 between the engagement pieces 15 and the sides of connecting hole 12 which have occurred due to hysteresis of the engagement piece 15 may cause a play in a direction perpendicular to the direction of connection, but since the positioning pin 21 fits into the connection positioning hole 23, any possible play in that direction is restricted and the accuracy of connection can be thus secured. Whilst, the locking protrusions 16 and the engagement surfaces 17 are engaged in a direction perpendicular to the direction of connection, and this provides for a connection with high connection strength.

When necessity occurs for releasing the connection of the holder units 1, the front end portions of the engagement pieces 15 are pulled so as to come closer to each other as shown by the arrows c in FIG. 1C, and pushed up as shown by the arrow d. By so doing, the engagement pieces 15 are elastically deformed and thus, the engagement between the locking projections 16 and the engagement surfaces 17 is released. Thus, the connecting projections 14 can be pulled out from the connecting holes 12, and the positioning pin 21 can also be easily pulled out from the connection positioning hole 23, so that connection can be comparatively easily released.

Figure 5:
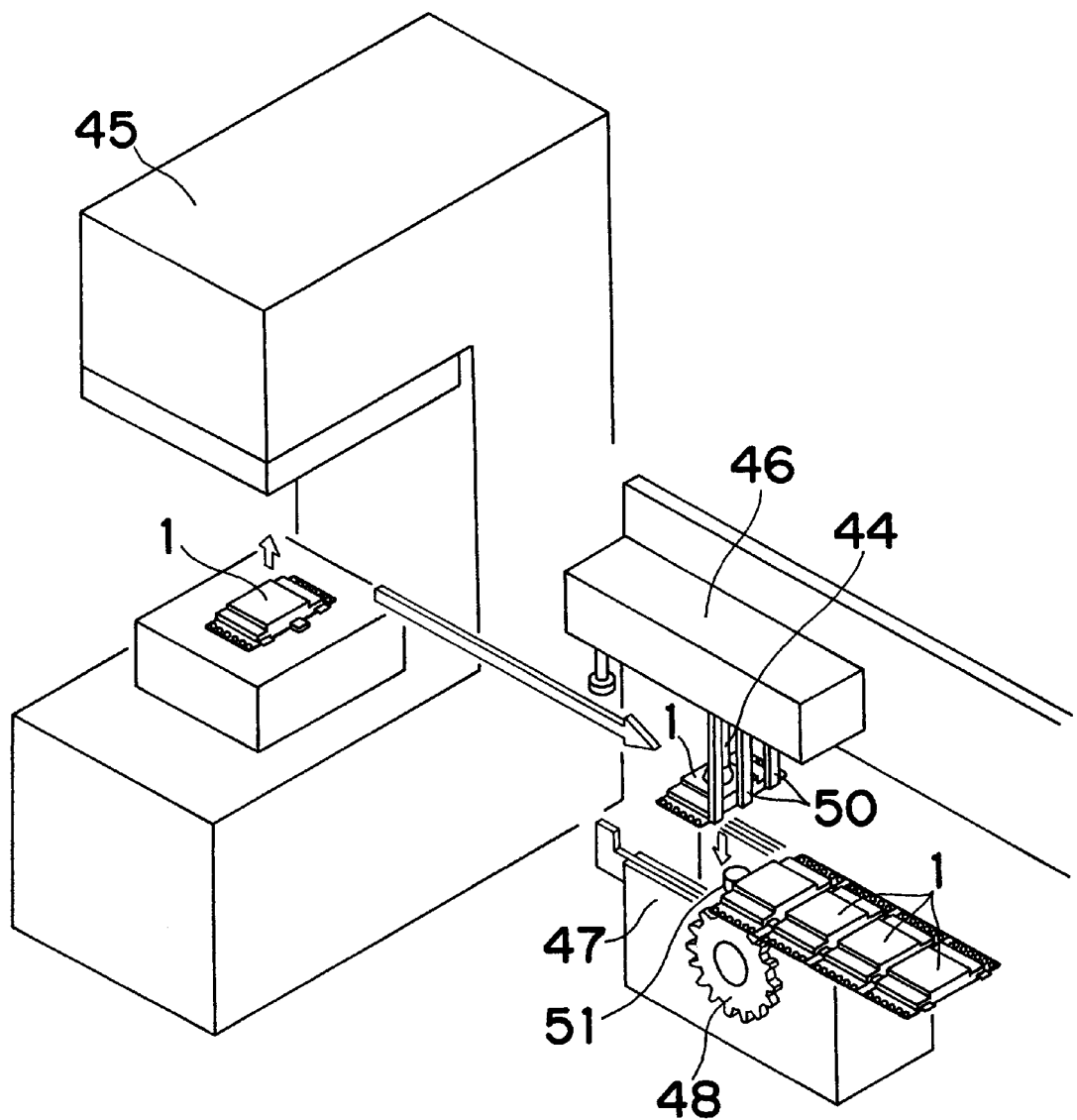
FIG. 5 is a perspective view of an apparatus for fabricating the component holder assembly of the embodiment.
Figure 6:
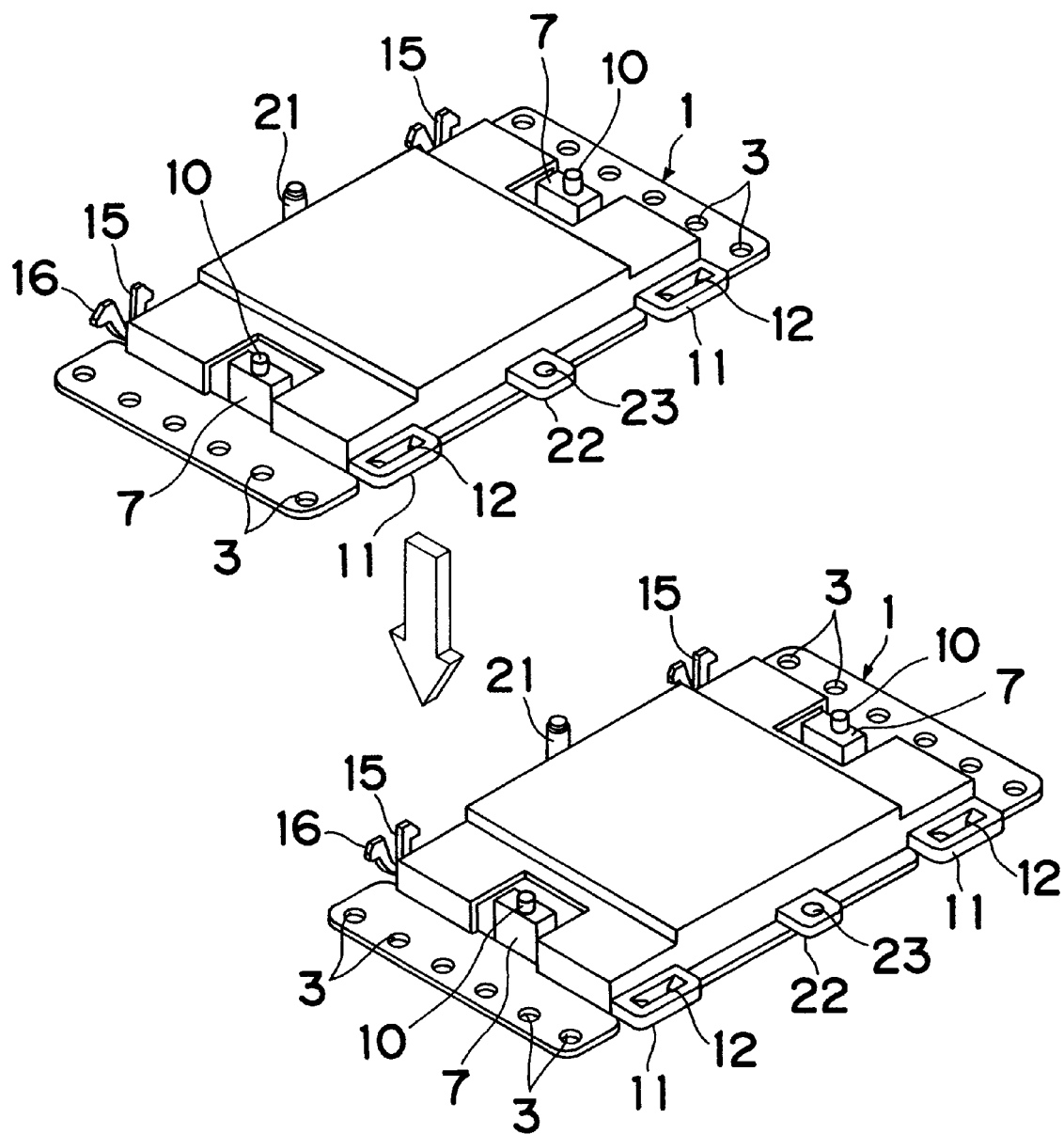
FIG. 6 is a perspective view showing operation of connecting holder units of the embodiment.
Figure 7:
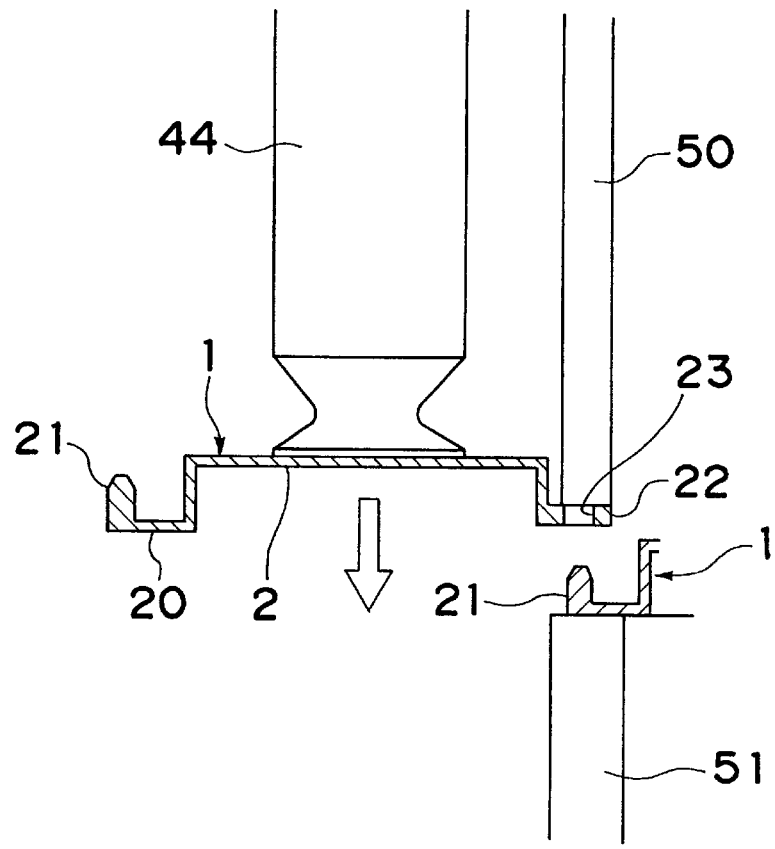
FIG. 7 is a sectional view showing operation of connecting the holder units of the embodiment.

In the above description, for ease of understanding, the connecting projections 14 and the positioning pin 21 are caused to descend toward and fit in the connecting holes 12 and the connection positioning hole 23 during the connecting operation. In an actual fabrication process, however, as shown in FIG. 5, the holder unit 1 molded by a molder 45, is sucked by a suction member 44, is transferred by a transfer member 46 onto a connector portion 47 on which a previously molded holder unit 1 is placed, and after the engagement pieces 15 and the positioning pin 21 are fitted in the connecting holes 12 and the connection positioning hole 23 to connect the holder units to each other, the component holders 1 are connected to sprockets 48 connected to a drive motor and caused to progress by one holder unit. For this purpose, it may be better to arrange that, as shown in FIGS. 6 and 7, the connecting holes 12 and the connection positioning hole 23 are fitted from above onto the connecting projections 14 and the positioning pin 21 of the component holder unit 1 sucked by the suction member 44 of the transfer member 46. This fitting is aided through the guidance of a support member 51 and presser members 50 for supporting the component holder unit 1, and the connecting projection 14 and the positioning pin 21 are supported on a placement surface, which facilitates the connecting operation. This also allows for molding and sequential connection of the holder units 1, and production with good mass productivity.

The positioning pin 21 is comprised of a substantially solid cylindrical pin, and this positioning pin 21 is adapted to closely fit in the circular connection positioning hole 23. This enables positioning with good accuracy in the direction of connection of the component holder units 1 and in the direction, of receipt and removal of the component hidden units 1 relative to the component holder unit 1. However, the construction of the positioning pin 21 is not limited to the foregoing, and may be comprised of a rectangular parallelepiped shape which enables positioning at least in two directions with high accuracy.

Figure 8:
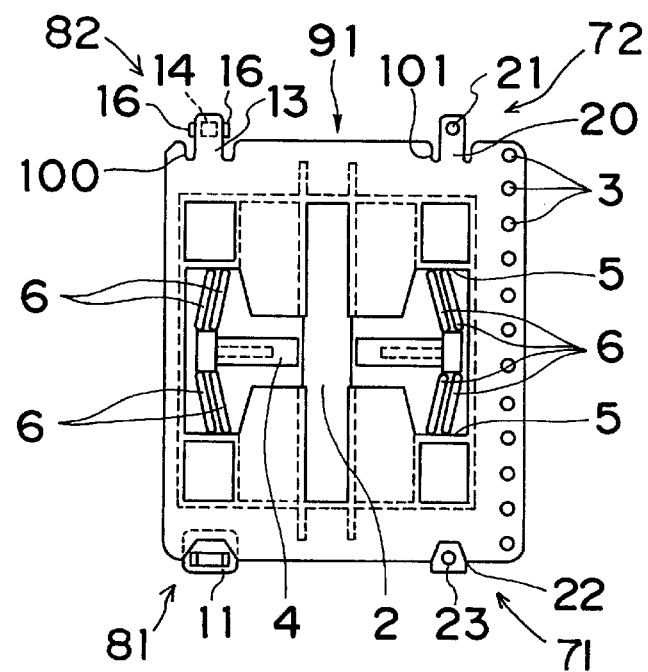
FIG. 8 is a plan view of a holder unit of another embodiment of the present invention.

The arrangement of the first connector portions 81 and the second connector portions 82 is not limited to one pair each. As shown in FIG. 8, in the case of a smaller component holder unit 1, there may be provided one each. That is, as shown in FIG. 8, the first connector portion 81 is disposed in the vicinity of one side of one end of each holder unit 1; the first connection positioning portion 71 is disposed in the vicinity of the other side of the one end; the second connector portion 82 is disposed in the vicinity of one side of the other end; and the second connection positioning portion 72 may be disposed in the vicinity of the other side of the other end.

According to the component holder assembly of the above described embodiment, as may be clear from the foregoing description, the positioning pin 21 of the second positioning portion 72 is disposed intermediate the connecting projections 14 of the one pair of second connector portions 82; and the connection positioning hole 23 of the first connection positioning portion 71 in which the positioning pin 21 fits for close engagement therewith is disposed intermediate the connecting holes 12 of the first connector portions into which the one pair of connecting projections 14 fit for engagement. Therefore, at the ends of the component holder unit 1 the positioning operation is carried out by the first positioning portion 71 cooperating with the second positioning portion 72 simultaneously with the connecting operation of the first connection portions 81 and the second connector portions 82. By so doing it is possible to inhibit, at the connecting portions, any play in the direction perpendicular to the direction of connection of the component holder units 1, and in the direction of the receipt and the removal of the components. Thus, the positioning of the component holder units 1 to each other can be performed with high accuracy in these two directions, and this makes it possible to readily connect the component holder units to each other and to obtain a highly accurate state of connection.

The first connector portion 81 is disposed in the vicinity of the one side of the one end of the respective holder units 1; the first connection positioning portion 71 is disposed in the vicinity of the other side of the one end; the second connector portion 82 is disposed in the vicinity of the one side of the other end of the respective holder units 1; and the second connection positioning portion 72 is disposed in the vicinity of the other side of the other end. Therefore, at the ends of the component holder unit 1, the positioning operation is carried out by the first connection positioning portion 71 cooperating the second connection positioning portion 72 simultaneously with the connecting operation of the first connector portion 81 and the second connector portion 82. By so doing, it is possible to inhibit, at the connecting portions of the first connector portion 81, and the second connector portion 82, any play in the direction perpendicular to the direction of connection of the component holder units 1, and in the direction of the receipt and the removal of the components. Thus, the positioning of the component holder units 1 to each other can be performed with high accuracy in these two directions, and this makes it possible to readily connect the component holder units to each other and to obtain a highly accurate state of connection.

Each of the first connector portions 81 has the connecting hole 12 penetrating the holder unit 1 in the direction of the receipt and the removal of the components relative to the component holder unit 1, and each of the second connector portions 82 has the connecting projection 14 extending in the direction of the receipt and the removal of the components relative to the component holder unit 1 and adapted to fit in the connecting hole 12 and protrude in the direction perpendicular to the direction of connection to engage the connecting hole 12. Each of the connecting projections 14 comprises the pair of engagement pieces 15 disposed in parallel spaced relation in the direction perpendicular to the direction of connection and elastically deformable toward each other. At the outer side of the front ends of the pair of engagement pieces 15 there are provided the locking projections 16 engageable with the peripheral edges of the longitudinally opposite ends of the connecting hole 12 for preventing dislocation. Thus, by elastically deforming the pair of engagement pieces 15 to come nearer to each other so as to allow the connecting projection 14 to fit into the connecting hole 12, it is possible to obtain a highly rigid connection. In addition, by the positioning pin 21 being closely fitted into the connection positioning hole 23 at the one end of the holder unit 1, it is possible to inhibit any play at the other holder unit 1 in the direction perpendicular to the direction of connection and in the direction of the receipt and the removal of components, and thus to obtain a highly accurate state of connection.

The entire disclosure of Japanese Patent Application No. 8-306211 filed on Nov. 18, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component holder unit, comprising:
   a first end portion and a second end portion spaced from one another in a first direction;
   a first opening in said first end portion; and
   a first flexible coupling member having a proximal end connected to said second end portion and a distal end spaced from said proximal end, wherein said first flexible coupling member is adapted to be received within the first opening of another said component holder unit such that as said first flexible coupling member is inserted into the first opening of the another said component holder unit said distal end flexes inwardly along a second direction that is generally transverse to said first direction, passes through the first end portion, and then flexes outwardly along said second direction whereby said first flexible coupling member becomes resiliently engaged within the first opening of the another said component holder unit.

2. The component holder unit according to claim 1, and further comprising a second opening in said first end portion, and a projection projecting from said second end portion, wherein said projection is adapted to be received within the second opening of the another said component holder unit.

3. The component holder unit according to claim 2, and further comprising:
   a third opening in said first end portion; and
   a second flexible coupling member having a proximal end connected to said second end portion and a distal end spaced from said proximal end, wherein said second flexible coupling member is adapted to be received within the third opening of the another said component holder unit such that as said second flexible coupling member is inserted into the third opening of the another said component holder unit said distal end of said second flexible coupling member flexes inwardly along said second direction, passes through the first end portion, and then flexes outwardly along said second direction whereby said second flexible coupling member becomes resiliently engaged within the third opening of the another said component holder unit.

4. The component holder unit according to claim 3, wherein said second opening is located between said first opening and said third opening, and said projection is located between said first flexible coupling member and said second flexible coupling member.

5. The component holder unit according to claim 4, wherein said first end portion has three flexible tabs extending therefrom, wherein said first flexible coupling member extends from one of said tabs, said projection extends from a second of said tabs, and said second flexible coupling member extends from the third of said tabs.

6. The component holder unit according to claim 5, wherein said three flexible tabs are each defined by a pair of notches extending into said first end portion.

7. The component holder unit according to claim 3, wherein said proximal end of each of said first flexible coupling member and said second flexible coupling member includes a pair of spaced resilient extensions, and said distal end of each of said first flexible coupling member and said second flexible coupling member includes a pair of locking projections extending from said pair of spaced resilient extensions, and wherein said pairs of locking projections are engageable with peripheral edges of the first and third openings, respectively, of the another said component holder to prevent said first and second flexible coupling members from disengaging from the first and third openings of the another said component holder unit, respectively.

8. The component holder unit according to claim 2, and further comprising first and second side portions spaced from one another in said second direction, wherein said first flexible coupling member and said first opening are located adjacent said first side portion, and said second opening and said projection are located adjacent said second side portion.

9. The component holder unit according to claim 8, wherein said first end portion has two flexible tabs extending therefrom, wherein said first flexible coupling member extends from one of said tabs, and said projection extends from the other of said tabs.

10. The component holder unit according to claim 9, wherein said two flexible tabs are each defined by a pair of notches extending into said first end portion.

11. The component holder unit according to claim 2, wherein said proximal end of said first flexible coupling member includes a pair of spaced resilient extensions, and said distal end of said first flexible coupling member includes a pair of locking projections extending from said pair of spaced resilient extensions, and wherein said pair of locking projections is engageable with peripheral edges of the first opening of the another said component holder unit to prevent said first flexible coupling member from disengaging from the first opening of the another said component holder unit.

12. The component holder unit according to claim 2, wherein said second opening comprises a circular hole extending through of said first end portion, and said projection comprises a cylindrical pin having a cross-sectional area slightly smaller than the cross-sectional area of said circular hole.

13. The component holder unit according to claim 2, wherein said proximal end of said first flexible coupling member is located a distance from said second end portion that is less than the distance that said projection extends from said second end portion, such that when the component holder unit is to be attached to the another said component holder unit said projection is received within the second opening of the another said component holder unit before said first flexible coupling member is received within the first opening of the another said component holder unit.

14. A component holder assembly, comprising:
    first and second component holder units each including
       (i) a first end portion and a second end portion spaced from one another in a first direction,
       (ii) a first opening in said first end portion, and
       (iii) a first flexible coupling member having a proximal end connected to said second end portion and a distal end spaced from said proximal end,
          wherein said first flexible coupling member of said first component holder unit is adapted to be received within said first opening of said second component holder unit such that as said first flexible coupling member of said first component holder unit is inserted into said first opening of said second component holder unit said distal end flexes inwardly along a second direction that is generally transverse to said first direction, passes through said first end portion of said second component holder unit, and then flexes outwardly along said second direction whereby said first flexible coupling member of said first component holder unit becomes resiliently engaged within said first opening of said second component holder unit.

15. The component holder assembly according to claim 14, wherein said first and second component holder units each further include:
    a second opening in said first end portion; and
    a projection projecting from said second end portion;
    wherein said projection of said first component holder unit is adapted to be received within said second opening of said second component holder unit.

16. The component holder assembly according to claim 15, wherein said first and second component holder units each further include:
    a third opening in said first end portion; and
    a second flexible coupling member having a proximal end connected to said second end portion and a distal end spaced from said proximal end;
    wherein said second flexible coupling member of said first component holder unit is adapted to be received within said third opening of said second component holder unit such that as said second flexible coupling member of said first component holder unit is inserted into said third opening of said second component holder unit said distal end flexes inwardly along said second direction, passes through said first end portion of said second component holder unit, and then flexes outwardly along said second direction whereby said second flexible coupling member becomes resiliently engaged within said third opening of said second component holder unit.

17. The component holder assembly according to claim 16, wherein for each of said first and second component holder units, said second opening is located between said first opening and said third opening, and said projection is located between said first flexible coupling member and said second flexible coupling member.

18. The component holder assembly according to claim 17, wherein said first end portion of each of said first and second component holder units has three flexible tabs extending therefrom, wherein said first flexible coupling member of each of said first and second component holder units extends from one of said tabs, respectively, said projection of each of said first and second component holder units extends from a second of said tabs, respectively, and said second flexible coupling member of each of said first and second component holder units extends from the third of said tabs, respectively.

19. The component holder assembly according to claim 18, wherein said three flexible tabs of each of said first and second component holder units are each defined by a pair of notches extending into said first end portion of each of said first and second component holder units.

20. The component holder assembly according to claim 16, wherein said proximal end of each of said first and second flexible coupling members of each of said first and second component holder units includes a pair of spaced resilient extensions, and said distal end of each of said first and second flexible coupling members of each of said first and second component holder units includes a pair of locking projections extending from said pair of spaced resilient extensions, and wherein each said pair of locking projections of said first flexible coupling members of said first component holder unit is engageable with peripheral edges of said first and third openings, respectively, of said second component holder unit to prevent said first and second flexible coupling members of said first component holder unit from disengaging from said first and third openings, respectively, of said second component holder unit.

21. The component holder assembly according to claim 15, wherein each of said first and second component holder units further includes first and second side portions spaced from one another in said second direction, and wherein said first flexible coupling member and said first opening of each of said first and second component holder units are located adjacent said first side portion of each of said first and second component holder units, respectively, and said second opening and said projection of each of said first and second component holder units are located adjacent said second side portion of each of said first and second component holder units, respectively.

22. The component holder assembly according to claim 21, wherein said first end portion of each of said first and second component holder units has two flexible tabs extending therefrom, wherein said first flexible coupling member of each of said first and second component holder units extends from one of said tabs, respectively, and said projection of each of said first and second component holder units extends from the other of said tabs, respectively.

23. The component holder assembly according to claim 22, wherein said two flexible tabs of each of said first and second component holder units are each defined by a pair of notches extending into said first end portion of each of said first and second component holder units.

24. The component holder assembly according to claim 15, wherein said proximal end of said first flexible coupling member of each of said first and second component holder units includes a pair of spaced resilient extensions, and said distal end of said first flexible coupling member of each of said first and second component holder units includes a pair of locking projections extending from said pair of spaced resilient extensions, and wherein said pair of locking projections of said first flexible coupling member of said first component holder unit is engageable with peripheral edges of said first opening of said second component holder unit to prevent said first flexible coupling member of said first component holder unit from disengaging from said first opening of said second component holder unit.

25. The component holder assembly according to claim 15, wherein said second opening of each of said first and second component holder units comprises a circular hole extending through said first end portion, and said projection of each of said first and second component holder units comprises a cylindrical pin having a cross-sectional area slightly smaller than the cross-sectional area of said circular hole.

26. The component holder assembly according to claim 15, wherein said proximal end of said first flexible coupling member of each of said first and second component holder units is located a distance from said second end portion of each of said first and second component holder units, respectively, that is less than the distance that said projection of each of said first and second component holder units extends from said second end portions, respectively, such that when said first component holder unit is to be attached to said second component holder unit said projection of said first component holder unit is received within said second opening of said second component holder unit before said first flexible coupling member of said first component holder unit is received within said first opening of said second component holder unit.

\* \* \* \* \*

UNITED STATES PATENT AND TRADEMARK OFFICE
CERTIFICATE OF CORRECTION

PATENT NO. : 6,152,304
DATED : November 28, 2000
INVENTOR(S) : Osamu Hikita et al.

It is certified that error appears in the above-identified patent and that said Letters Patent is hereby corrected as shown below:

Title page,
Item [56] References Cited, under FOREIGN PATENT DOCUMENTS insert the following two Japanese references:

6-1556562    6/1994    Japan
        7-165287     6/1995    Japan

Signed and Sealed this

Thirtieth Day of October, 2001

Attest:

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO. : 6,152,304
DATED : November 28, 2000
INVENTOR(S) : Osamu Hikita et al.

It is certified that error appears in the above-identified patent and that said Letters Patent is hereby corrected as shown below:

<u>Title page,</u>
Item [56], References Cited, FOREIGN PATENT DOCUMENTS, insert the following two Japanese references:
-- 6-156562    6/1994    Japan
   7-165287    6/1995    Japan --

Signed and Sealed this

Twenty-seventh Day of January, 2004

JON W. DUDAS
*Acting Director of the United States Patent and Trademark Office*